United States Patent [19]
Carobolante et al.

[11] Patent Number: 5,397,967
[45] Date of Patent: Mar. 14, 1995

[54] SLEW RATE CIRCUIT FOR HIGH SIDE DRIVER FOR A POLYPHASE DC MOTOR

[75] Inventors: Francesco Carobolante, Phoenix, Ariz.; Ali J. Rastegar, Santa Clara, Calif.

[73] Assignee: SGS-Thomson Microelectronics, Inc., Carrollton, Tex.

[21] Appl. No.: 906,511

[22] Filed: Jun. 30, 1992

[51] Int. Cl.[6] .............................................. H02P 1/18
[52] U.S. Cl. .................................. 318/254; 318/439; 388/815; 388/910
[58] Field of Search ....................... 318/254, 138–139, 318/439, 597, 738, 767–768; 388/806, 809, 815, 910

[56] References Cited

U.S. PATENT DOCUMENTS

| | | | |
|---|---|---|---|
| 4,008,424 | 2/1977 | Bompani | 388/814 X |
| 4,743,815 | 5/1988 | Gee et al. | 318/254 |
| 5,160,873 | 11/1992 | Tukiyama et al. | 318/254 |
| 5,191,269 | 3/1993 | Carobolante | 318/254 |
| 5,210,474 | 4/1993 | Oswald | 318/254 |

Primary Examiner—William M. Shoop, Jr.
Assistant Examiner—David Martin
Attorney, Agent, or Firm—Richard A. Bachard; Lisa K. Jorgenson; Richard K. Robinson

[57] ABSTRACT

A high side driver circuit and method for controlling the turnoff slew rate to an inductor of a motor is presented. The inductor is selectively connected between a supply voltage on a high side and a reference potential on a low side. The driver circuit has a power transistor having a current control path connected in series between the high side of the inductor and the supply voltage to connect selectively the inductor to the supply voltage. An amplifier has an output connected to a control element of the power transistor. A capacitor connected between a non-inverting input of the amplifier and the reference potential and a current source connected between the non-inverting input of the amplifier and the reference potential are switchably connected between the supply voltage and the non-inverting input of the amplifier for turning on and off the circuit. A feedback path is connected between the high side of the coil and an inverting input of the amplifier.

19 Claims, 1 Drawing Sheet

SLEW RATE CIRCUIT FOR HIGH SIDE DRIVER FOR A POLYPHASE DC MOTOR

BACKGROUND OF THE INVENTION

1. Field of the Invention

This invention relates to circuitry for use in motor drivers, and more particularly to improvements in slew rate controlling circuits for use in drivers for polyphase dc motors or the like.

2. Technical Background

In the past, the slew rate of the upper driver in polyphase dc motor driver circuits was controlled in an approximate or rough manner by an R-C circuit connected to the gate of the driver transistor. The R-C circuit was designed to discharge the gate and to provide a slew rate upon the gate that approximately equaled the particular slew rate of the high side of the driver to which the drive transistor was connected. It can therefore be seen that the charging and discharging of the gate of the driver transistor was at a limited, fixed rate, depending upon the particular R-C constant selected.

To "optimize" the slew rate, typically the resistor, was trimmed for the particular application. Thus, each application required specific adjustment of the R-C circuit. This was dependent upon many factors, some of which were very difficult to control such as the parasitic capacitances of the driver transistor and so on. Thus, the particular design of the R-C circuit that was employed within a particular driver circuit was dependent upon the characteristics of the particular driver transistor that was used.

Two major problems exist in this type of compensation. The first problem is that the slew rate is not very well controlled. This is a result of the non-linear characteristics of the intrinsic capacitors of the driver transistor. The second problem that is encountered is that if the driver transistor were used in usual fashion as a switch, and is heavily turned on, typically the gate voltage is much higher than the source voltage, sometimes by as much as ten volts or more. To turn off the transistor, the over voltage first needed to be discharged before the turnoff of the transistor could be effected. After that the slew rate circuit would become effective to produce the desired turn off slew rate.

Since the R-C circuit is essentially custom designed for the slew rate, it also controls the over voltage discharge at its particular discharge rate. This results in a delay before the slewing characteristics desired are initiated. That is, nothing in the output occurs until the gate voltage discharges to a value close to the threshold for the particular transistor. The result is a delay from the turn off command that is dependent upon the slew rate circuit design.

SUMMARY OF THE INVENTION

Considering the above, it is, therefore, an object of the invention to provide a circuit for controlling the slew rate of the top (high side) transistor of an inductive load driver.

It is another object of the invention to provide a circuit of the type described that can be used to provide drive power to the inductive coils of a motor.

It is another object of the invention to provide a circuit of the type described that can be integrated into a single integrated circuit device.

It is another object of the invention to provide a circuit that enables a slew rate to be generated that can be matched to the slew rate of a low side driver of an associated low side driver circuit.

It is yet another object of the invention to provide a circuit of the type described that provides sufficient compensation for the stability of a driver operational amplifier that controls the high side driver transistor.

These and other objects, features, and advantages of the invention will be appreciated by those skilled in the art from the following detailed description when read with the accompanying drawings and appended claims.

According to a broad aspect of the invention, a high side driver circuit for controlling the turnoff slew rate to an inductor of a motor is presented. The inductor is selectively connected between a supply voltage on a high side and a reference potential on a low side. The driver circuit has a power transistor having a current control path connected in series between the high side of the inductor and the supply voltage selectively to connect the inductor to the supply voltage. An amplifier has an output connected to a control element of said power transistor. A capacitor connected between a non-inverting input of said amplifier and the reference potential and a current source connected between the non-inverting input of said amplifier and the reference potential are switchably connected between the supply voltage and the non-inverting input of said amplifier for turning on and off the circuit. A feedback path is connected between the high side of said coil and an inverting input of said amplifier.

According to another broad aspect of the invention, a method for controlling the high side driver turnoff slew rate to an inductor of a motor is presented. The inductor is selectively connected between a supply voltage on a high side and a reference potential on a low side is presented. The method includes comparing a voltage on a capacitor with a voltage on a high side of the inductor. The capacitor is discharged at a constant rate when the drive to the inductor is turned off, and a voltage derived from the compared voltages is applied to control the current supplied to the high side of the inductor.

BRIEF DESCRIPTION OF THE DRAWINGS

The invention is illustrated in the accompanying drawing, in which.

In the Figures of the drawings, like reference numerals are used to denote like or similar parts.

DETAILED DESCRIPTION OF A PREFERRED EMBODIMENT

Figure 1:
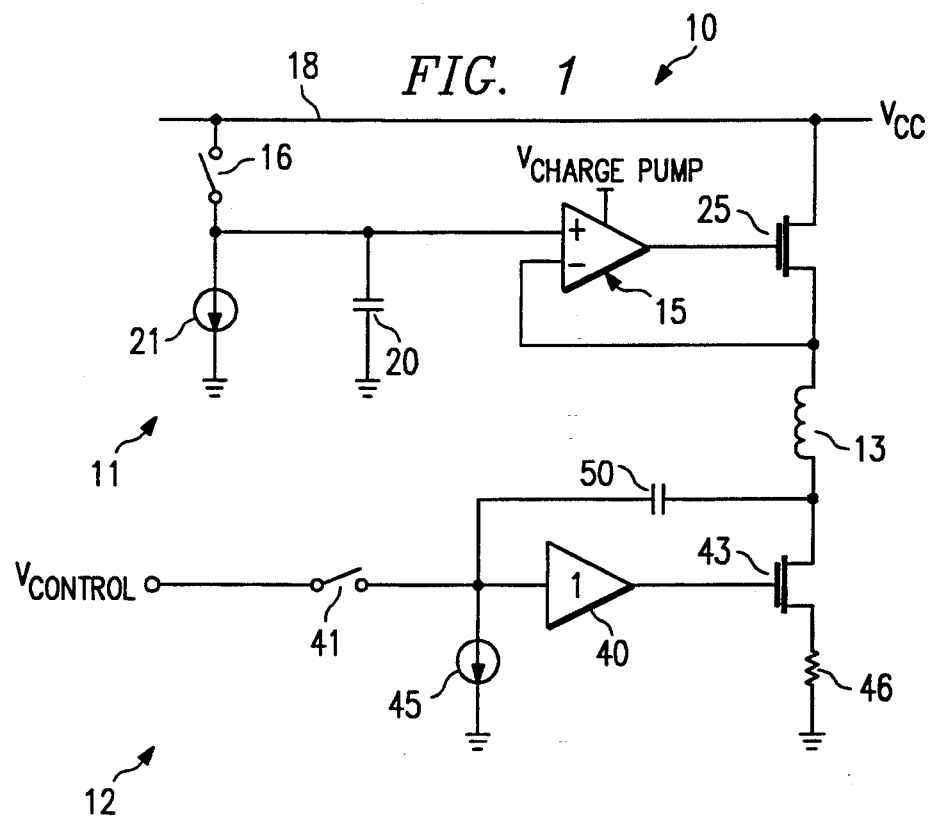
FIG. 1 is an electrical schematic diagram, illustrating a high side motor coil driver, according to the invention, used with a low side coil driver.

A preferred embodiment of the invention is shown in the electrical schematic diagram of FIG. 1. The circuit 10 includes a high side driver circuit 11 and a low side driver circuit 12 connected to one phase of a motor coil 13. A similar set of high and low side driver circuits is provided for each phase of the motor, but are not illustrated. For example, if a three-phase motor is driven, three sets of circuitry similarly constructed to the circuit 10 will be employed. A typical motor driver arrangement is shown in Pat. No. 5,306,988, issued on Apr. 26, 1994, said patent being incorporated herein by reference.

The upper driver circuit 11 includes an operational amplifier 15 that has a switch 16 connected between its non-inverting input and a voltage source on line 18. The switch 16 can be, for example, an FET switch that is operated in response to a sequence circuit (not shown). Such sequence circuits are known in the art. A capacitor 20 is connected between the non-inverting input of the amplifier 15 and a reference potential or ground. Additionally, a current source 21 is connected in parallel with the capacitor 20 between the non-inverting input of the amplifier 15 and the reference potential.

The output from the amplifier 15 is connected to the gate of an FET 25. The FET 25 serves to apply the voltage from the voltage source on line 18 to one side (the high side) of the coil 13 of the motor. In addition, the high side of the coil 13 of the motor is connected to the inverting input of the amplifier 15. This provides a reference against which the input on the inverting input of the amplifier 15 is compared. The circuit 11 operates by virtue of the feedback to the inverting input of the amplifier 15, forcing the amplifier 15 and the high side of the coil 13 to follow the linear voltage on the non-inverting input.

In operation, when the switch 16 is closed, the supply voltage on line 18 is applied to charge the capacitor 20. When the switch 16 is subsequently opened, the charge that has been established on the capacitor 20 discharges at a constant rate to ground through the constant current source 21. Since the top of the capacitor 20 is connected to the non-inverting input of the amplifier 15, the output of the amplifier 15 is forced also to be reduced at the rate of the discharge of the charge established previously on the capacitor 20. Because of the discharge through the constant current source 21, the capacitor discharge is essentially linear. The feedback path to the inverting input of the amplifier 15 is used to sample the voltage on the high side of the coil 13. The sample voltage is compared to the voltage on the linearly discharging capacitor. As a result, the gate voltage responds appropriately by following the linear discharge of the capacitor 20.

The circuit 10, therefore, operates to first force the over voltage that exists on the gate of the transistor 25 to diminish rapidly to the threshold voltage of the transistor 25. After that, the transistor 25 is then caused to slew at a linear rate determined by the discharge of the capacitor 20 through the current source 21. Thus, it will be appreciated that the circuit 10 establishes the desired slew rate independently of the particular characteristics of the driver transistor 25 that is used.

The circuit of the lower driver includes a unity gain amplifier 40 connected between an input switch 41 and the gate of a low side driving FET transistor 43. The switch 41 is connected to receive an output from the motor driver sequence circuit, and is applied to the input of the unity gain amplifier 40. A current source 45 is provided from the input of the unity gain amplifier to a reference potential, or ground.

The FET 43 is connected between the low side of the coil 13 of the motor and the reference potential. A resistor 46 can be provided in the source path of the FET 43 if desired. Finally, a capacitor 50 is provided between the low side of the coil 13 of the motor and the input to the unity gain amplifier 40.

With the circuit constructed in the manner illustrated, it will be appreciated that the slew rate of the upper driver circuit 11 will be $dV/dt = -I_S/C_{20}$. On the other hand, the slew rate of the lower driver circuit 12 will be $dV/dt = I_S/C_{50}$.

One advantage of the circuit 10 is that the slew rate of the upper driver circuit 11 can be matched to the slew rate of the lower driver circuit 12. This is done by matching the ratios of the capacitors 20 and 50 and the current sources 21 and 45. If it is desired to produce a circuit with the same slew rates in the upper and lower drivers, the values of the capacitors 20 and 50 can be made equal, and the current supplied by the current sources 21 and 45 also can be made equal. Of course, the capacitors and current sources can be adjusted for any particular ratio to get several slew rates or any other desired slew rate ratio.

It will be appreciated by those skilled in the art that although the embodiment shown in FIG. 1 employs N-channel D-MOS transistors, different power devices can be equally advantageously employed. In addition, by reversing the direction of the current sources 21 and 45, and with appropriate switch modifications, the circuit can be used in turn-on slewing applications as well as the turn-off functions described above.

Figure 2:
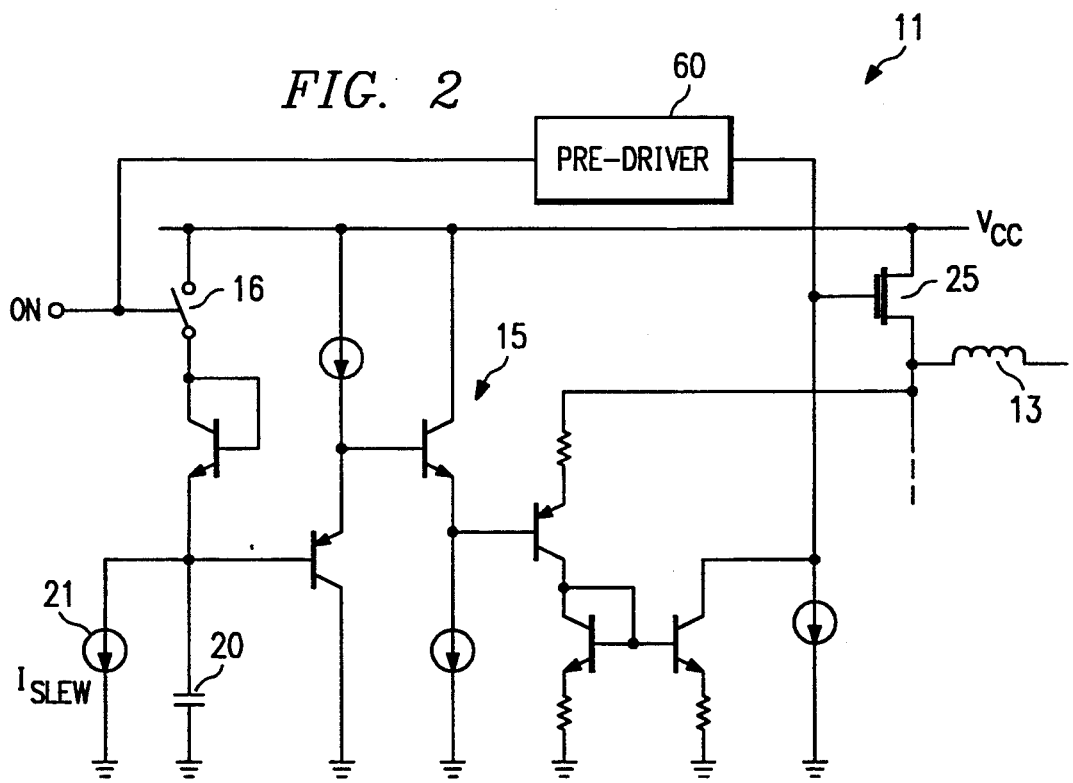
FIG. 2 is an electrical schematic of a preferred embodiment of a high side coil driver circuit of the invention.

A bipolar transistor embodiment of the high side driver circuit 10 is shown in greater detail in FIG. 2. The circuit is constructed similarly to the circuit described above in FIG. 1, except that a predriver circuit 60 is provided to receive the signal controlling the switch 16, and provide a predriving signal to the gate of the upper driver transistor 25.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A high side driver circuit which controls the turn-off slew rate to an inductor of a motor that is selectively connected between a supply voltage on a high side and a reference potential on a low side, comprising:
   a power transistor having a current control path connected in series between the high side of the inductor and the supply voltage to connect selectively said inductor to the supply voltage;
   an amplifier having an output connected to a control element of said power transistor;
   a capacitor connected between a non-inverting input of said amplifier and the reference potential;
   a current source connected between the non-inverting input of said amplifier and the reference potential;
   a switch connected between the supply voltage and the non-inverting input of said amplifier for connecting the supply voltage to the non-inverting input of the amplifier;
   and a feedback path connected between the high side of said coil and an inverting input of said amplifier.

2. The circuit of claim 1 wherein said power transistor is a power N-channel DMOS transistor.

3. The circuit of claim 1 wherein said inductor is one phase of a polyphase motor.

4. The circuit of claim 1 further comprising a low side driver circuit for connection to the low side of said inductor.

5. The circuit of claim 4 wherein the slew rate of said high side and low side drivers are equal.

6. The circuit of claim 4 wherein said low side driver circuit comprises:
  a power transistor having a current path connected between the low side of said inductor and the reference potential;
  a unity gain amplifier having an output connected to a control element of said power transistor;
  a current source connected between an input of said unity gain amplifier and the reference potential;
  a capacitor connected between the low side of said inductor and the input of said unity gain amplifier;
  and a switch connected in series between a control circuit and the input of said unity gain amplifier.

7. The circuit of claim 6 wherein the capacitors of said high and low side drivers are equal and the current of the current sources of the high and low side drivers are equal.

8. The circuit of claim 7 wherein the slew rate of said high side and low side drivers are equal.

9. The circuit of claim 6 wherein the values of the capacitors of said high and low side drivers and the values of the current of the current sources of the high and low side drivers are ratioed to produce slew rates of the high and low side drivers of a desired ratio.

10. A high side driver circuit which controls the turnoff slew rate to an inductor of a motor that is selectively connected between a supply voltage on a high side and a reference potential on a low side, comprising:
  a power transistor having a current control path connected in series between the high side of the inductor and the supply voltage to connect selectively said inductor to said supply voltage;
  a switch;
  a capacitor connected between a non-inverting input of an amplifier and the reference potential, said capacitor being switchably connected by said switch to a supply voltage to charge said capacitor when said power transistor is to be turned-on and to allow said capacitor to discharge when said power transistor is to be turned-off;
  a constant current source connected in parallel with the capacitor for discharging the capacitor at a constant rate;
  and an amplifier having a non-inverting input connected to said capacitor and having an output connected to a control element of said power transistor to compare a voltage on said capacitor with a voltage on the high side of said inductor.

11. The high side driver circuit of claim 10 wherein said power transistor is a power N-channel DMOS transistor.

12. A method for controlling the high side driver turnoff slew rate to an inductor of a motor that is selectively connected between a supply voltage on a high side and a reference potential on a low side, comprising:
  comparing a voltage on a capacitor with a voltage on a high side of the inductor;
  linearly discharging the capacitor when the drive to the inductor is turned-off;
  and applying a voltage derived from the compared voltages to a transistor that is connected to control the current supplied to the high side of the inductor.

13. The method of claim 12 wherein said step of discharging the capacitor at a constant rate is performed by providing a constant current source in parallel with said capacitor.

14. The method of claim 12 wherein said step of comparing a voltage on a capacitor with a voltage on a high side of the inductor is performed by subtracting the voltage on the inductor from the voltage on the capacitor.

15. The method of claim 12 wherein said step of applying the voltage derived from the compared voltages to control the current supplied to the high side of the inductor comprises applying an output of an amplifier to a gate of a field effect power transistor that has a current path in series with said inductor.

16. The method of claim 12 wherein said inductor is one phase of a polyphase motor.

17. The method of claim 12 further comprising providing a low side driver circuit for connection to a low side of said inductor.

18. The method claim 17 further comprising adjusting the slew rates of said high side and low side drivers to be equal.

19. The method of claim 18 wherein said step of adjusting the slew rates comprises providing capacitors for said high and low side drivers that are equal.

* * * * *